(12) United States Patent
Ningrat et al.

(10) Patent No.: US 9,348,469 B2
(45) Date of Patent: May 24, 2016

(54) PATTERNED CONDUCTIVE LAYERS FOR SENSOR ASSEMBLY AND METHOD OF MAKING THE SAME

(75) Inventors: Kusuma Adi Ningrat, Singapore (SG); Wah Wah Soe, Singapore (SG)

(73) Assignee: STMicroelectronics Asia Pacific Pte Ltd, Singapore (SG)

(*) Notice: Subject to any disclaimer, the term of this patent is extended or adjusted under 35 U.S.C. 154(b) by 1050 days.

(21) Appl. No.: 13/338,015

(22) Filed: Dec. 27, 2011
(Under 37 CFR 1.47)

(65) Prior Publication Data

US 2012/0300140 A1    Nov. 29, 2012

Related U.S. Application Data

(60) Provisional application No. 61/427,645, filed on Dec. 28, 2010.

(51) Int. Cl.
| | |
|---|---|
| *G02F 1/1335* | (2006.01) |
| *G06F 3/044* | (2006.01) |
| *H03K 17/96* | (2006.01) |
| *G02F 1/1333* | (2006.01) |

(52) U.S. Cl.
CPC ............ *G06F 3/044* (2013.01); *G02F 1/13338* (2013.01); *H03K 17/9622* (2013.01); *G06F 2203/04107* (2013.01); *H03K 2217/96031* (2013.01); *H03K 2217/960775* (2013.01); *Y10T 29/49124* (2015.01)

(58) Field of Classification Search
USPC ............................................. 349/12; 345/174
See application file for complete search history.

(56) References Cited

U.S. PATENT DOCUMENTS

| | | | |
|---|---|---|---|
| 7,864,503 B2 * | 1/2011 | Chang ........................... | 361/288 |
| 2009/0066670 A1 * | 3/2009 | Hotelling et al. ............. | 345/174 |
| 2010/0019780 A1 | 1/2010 | Bulea | |
| 2010/0045632 A1 * | 2/2010 | Yilmaz et al. ................. | 345/174 |

* cited by examiner

*Primary Examiner* — Lucy Chien
(74) *Attorney, Agent, or Firm* — Gardere Wynne Sewell LLP

(57) ABSTRACT

An ITO sensor design and method for making the same is optimized to minimize noise from an LCD. The design includes a two layer sensor design having a transmitter line (Tx) placed in a first layer and a receiver line (Rx) placed in a second layer in a diamond-shaped pattern. The diamond shape maximizes the sensitivity of the sensor.

19 Claims, 10 Drawing Sheets

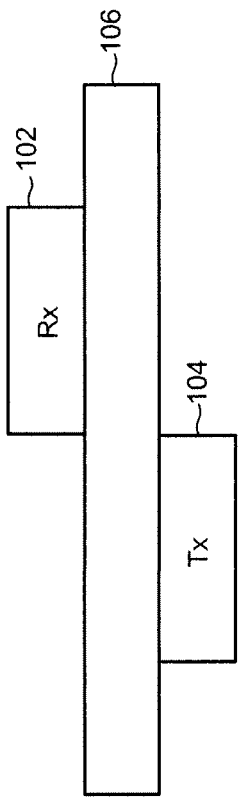
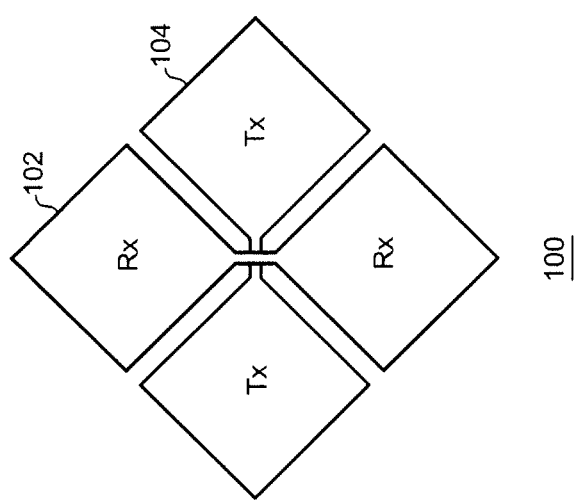
Fig. 1B
Related Art
Fig. 1A
Related Art

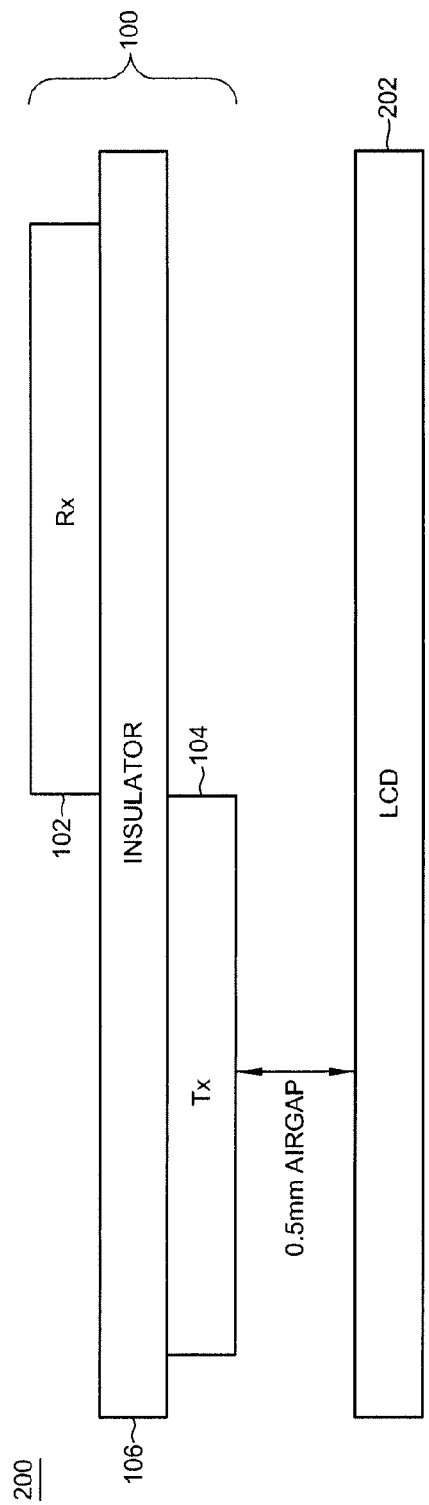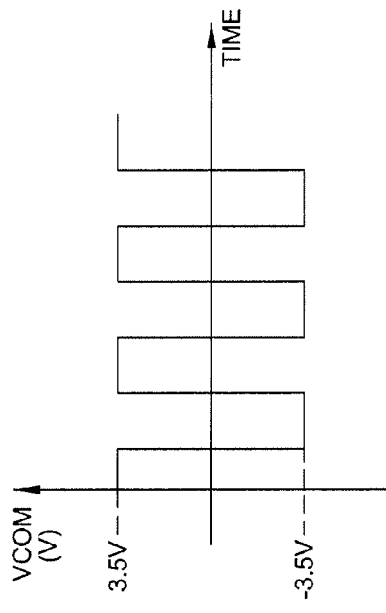
Fig. 2
Related Art
Fig. 3
Related Art

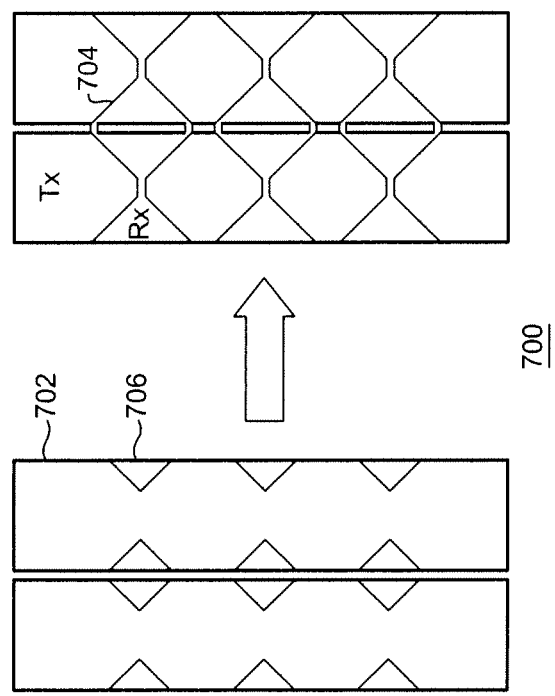

PATTERNED CONDUCTIVE LAYERS FOR SENSOR ASSEMBLY AND METHOD OF MAKING THE SAME

RELATED APPLICATION

The present invention claims priority from U.S. Provisional Patent Application Ser. No. 61/427,645 filed Dec. 28, 2010, and is incorporated herein by reference in its entirety for all purposes as if fully set forth herein.

BACKGROUND OF THE INVENTION

1. Field of the Invention

The invention generally relates to an apparatus and method of making a sensor design for a capacitive sensor, and more particularly to an indium tin oxide (ITO) sensor design for a liquid crystal display (LCD).

2. Discussion of the Related Art

Currently touch capacitive sensors are used widely for a number of different touch screens, e.g., continuous capacitive sensors and discontinuous capacitive sensors. FIG. 1A illustrates a top view of a related art sensor assembly. FIG. 1B illustrates a cross-sectional view of the sensor assembly in FIG. 1A.

Referring to FIGS. 1A-1B, the sensor assembly is generally depicted as reference number 100. The sensor assembly 100 includes a receiver line 102, a transmitter line 104 and an insulator 106 arranged between the receiver line 102 and the transmitter line 104. The receiver line 102 and the transmitter line 104 are arranged in a diamond pattern.

FIG. 2 illustrates a cross-sectional view of a related art sensor of FIG. 1 in a LCD display apparatus. Referring to FIG. 2, the LCD display apparatus is generally depicted as reference number 200. The LCD display apparatus includes a LCD 202 and a sensor assembly 100, with LCD 202 being located underneath the sensor assembly 100. An air gap between the LCD 202 and sensor assembly may be about 0.35 mm, thereby creating a capacitance between the receiver line 102 and the transmitter line 104, e.g., about 2 pF or bigger. In operation the voltage of the VCOM plane (not shown) may change in a square wave manner as shown in FIG. 2 and may have a magnitude of about 7Vp-p. FIG. 4 illustrates an electric field simulation of noise generated in operation of related art device of FIG. 2.

Referring to FIGS. 3 and 4, it shown that the electric field from the VCOM plane (not shown) may go directly to the receiver line 102. More specifically, when the VCOM voltage changes it injects a charge into the receiver line 102 (noise), which leads to measurement error. Therefore, the related art design exposes the receiving line to LCD noise.

Accordingly, there is a need to overcome the problems with the related art described above.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings:

FIG. 1A illustrates a top view of a sensor assembly according to the related art;

FIG. 1B illustrates a cross-sectional view of the sensor assembly of FIG. 1A;

FIG. 2 illustrates a cross-sectional view of a LCD display touch screen apparatus according to the related art;

FIG. 3 illustrates a voltage diagram of a VCOM plane of the apparatus of FIG. 2;

FIGS. 7A and 7B illustrate a top view of a sensor assembly according to another embodiment of the invention;

SUMMARY OF THE INVENTION

Accordingly, the invention is directed to sensor assemblies that substantially obviate one or more of the problems due to limitations and disadvantages of the related art.

An advantage of the invention is to provide sensor design that substantially eliminates LCD noise.

Another advantage of the invention is to provide a two layer sensor pattern to provide better performance for use with current or future capacitive sensor technology.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a sensor assembly apparatus includes a conductive material arranged into a plurality of rows and a plurality of conductive electrode patterns arranged over the plurality of rows, wherein at least one of the plurality of rows is coupled to an analog ground to shield the plurality of conductive diamond patterns from electrical noise.

Another aspect of the present invention is directed towards a touch panel assembly. The touch panel assembly includes a patterned layer of conductive material that includes a plurality of electrodes, a plurality of conductive patterns arranged over at least a portion of the plurality of electrodes, and a LCD module arranged under the pattern layer and plurality of conductive patterns. The plurality of electrodes is grounded by an analog ground connection to provide shielding to the conductive patterns.

Yet another aspect of the invention is directed towards a method for manufacturing a sensor assembly. The method includes the steps of providing a substrate, e.g., glass, plastic, and the like. A layer of conductive material is formed over the substrate and forms a patterned conductive material over the layer, wherein the layer of transparent conductive material is grounded. It is to be understood that both the foregoing general description and the following detailed description are exemplary and explanatory and are intended to provide further explanation of the invention as claimed.

DETAILED DESCRIPTION OF THE ILLUSTRATED EMBODIMENTS

Reference will now be made in detail to an embodiment of the present invention, an example of which is illustrated in the accompanying drawings.

Figure 4:
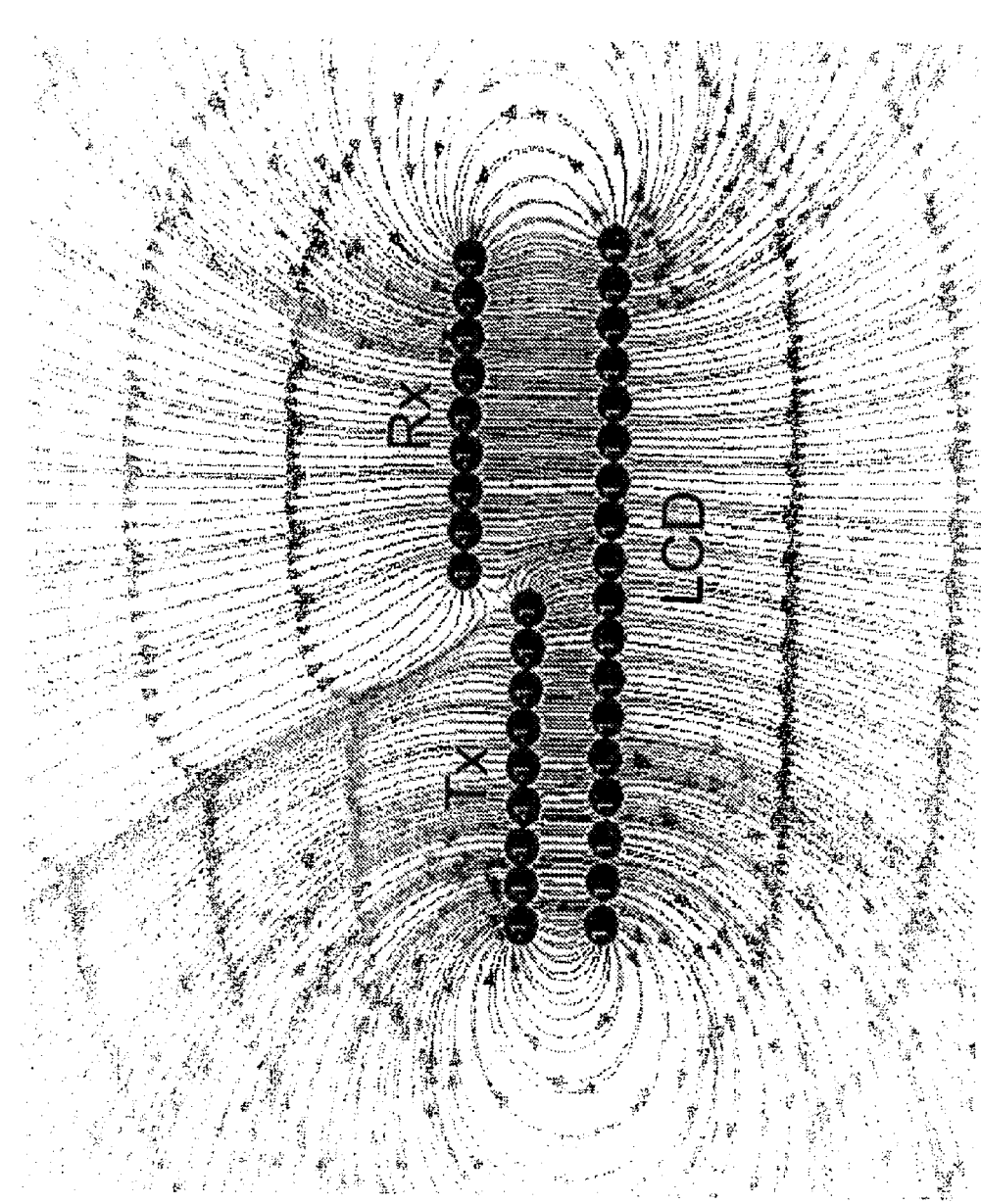
FIG. 4 illustrates a modeling of the electrical field of the apparatus of FIG. 2.
Figure 5:
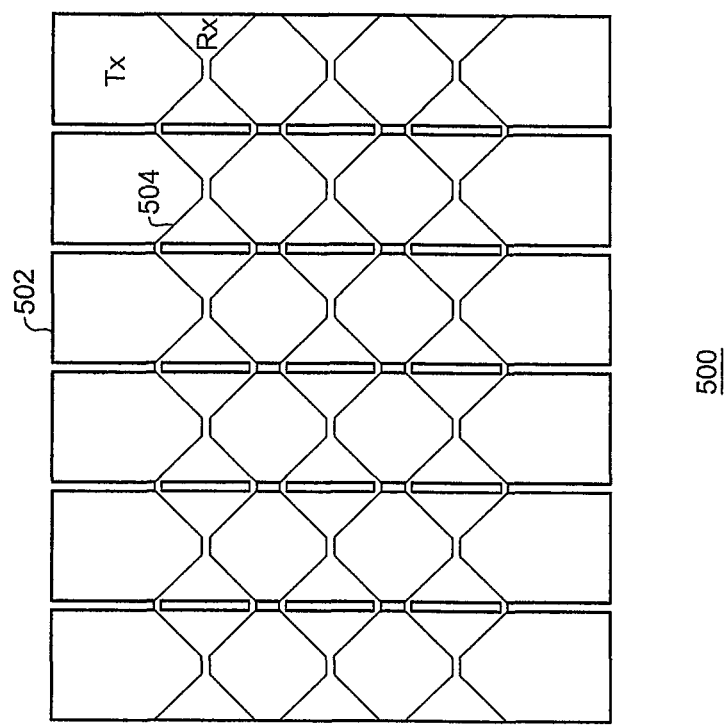
FIG. 5 illustrates a top view of a sensor assembly according to an embodiment of the invention.

FIG. 5 illustrates a top view of a sensor assembly according to an embodiment of the invention.

Referring to FIG. 5, the sensor assembly is generally depicted as reference number 500. The sensor assembly 500 includes a receiver line 504 and a transmitter line 502 formed from conductive material, e.g., ITO. The receiver line 504 is formed in a pattern having a diamond shape to increase sensitivity of the sensor.

Figure 6:
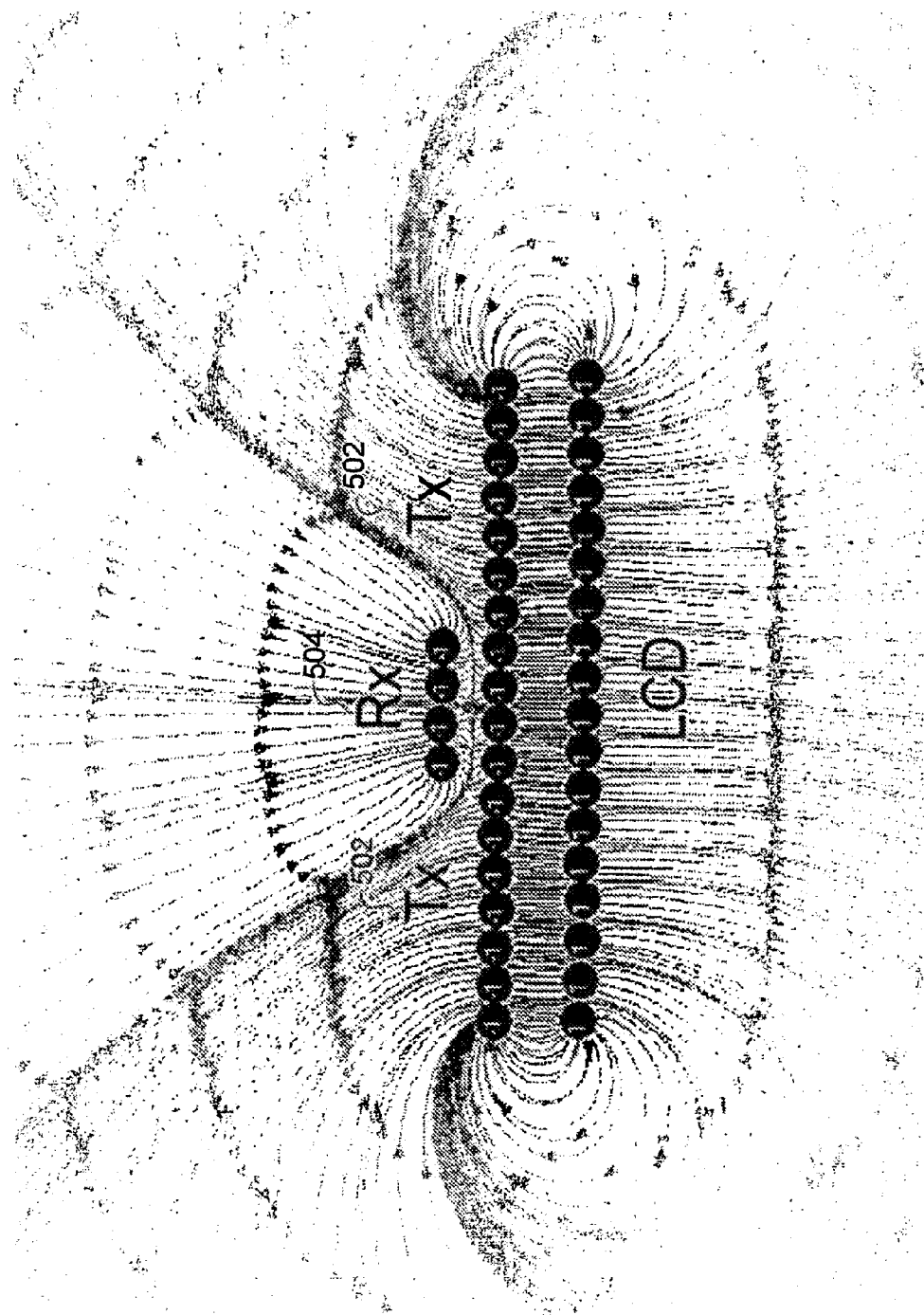
FIG. 6 illustrates a modeling of the electrical field of the sensor assembly of FIG. 5A.

FIG. 6 illustrates a modeling of the electrical field of the sensor assembly of FIG. 5. Referring to FIG. 6, it is shown that noise is reduced or eliminated, that is, the electric field lines from the LCD (not shown) are blocked by transmitter lines 502 and the receiver line 504 can acquire a signal from the transmitter lines 502 and not from other sources. It is noted that other shapes for the receiver line may also be used; however, a larger diamond shaped receiver line has increased parasitic mutual capacitance values between the transceiver lines and receiver lines, which may be out of the dynamic range of a sensor controller (not shown).

FIGS. 7A and 7B illustrates a top view of a sensor assembly according to another embodiment of the invention.

Figure 7C:
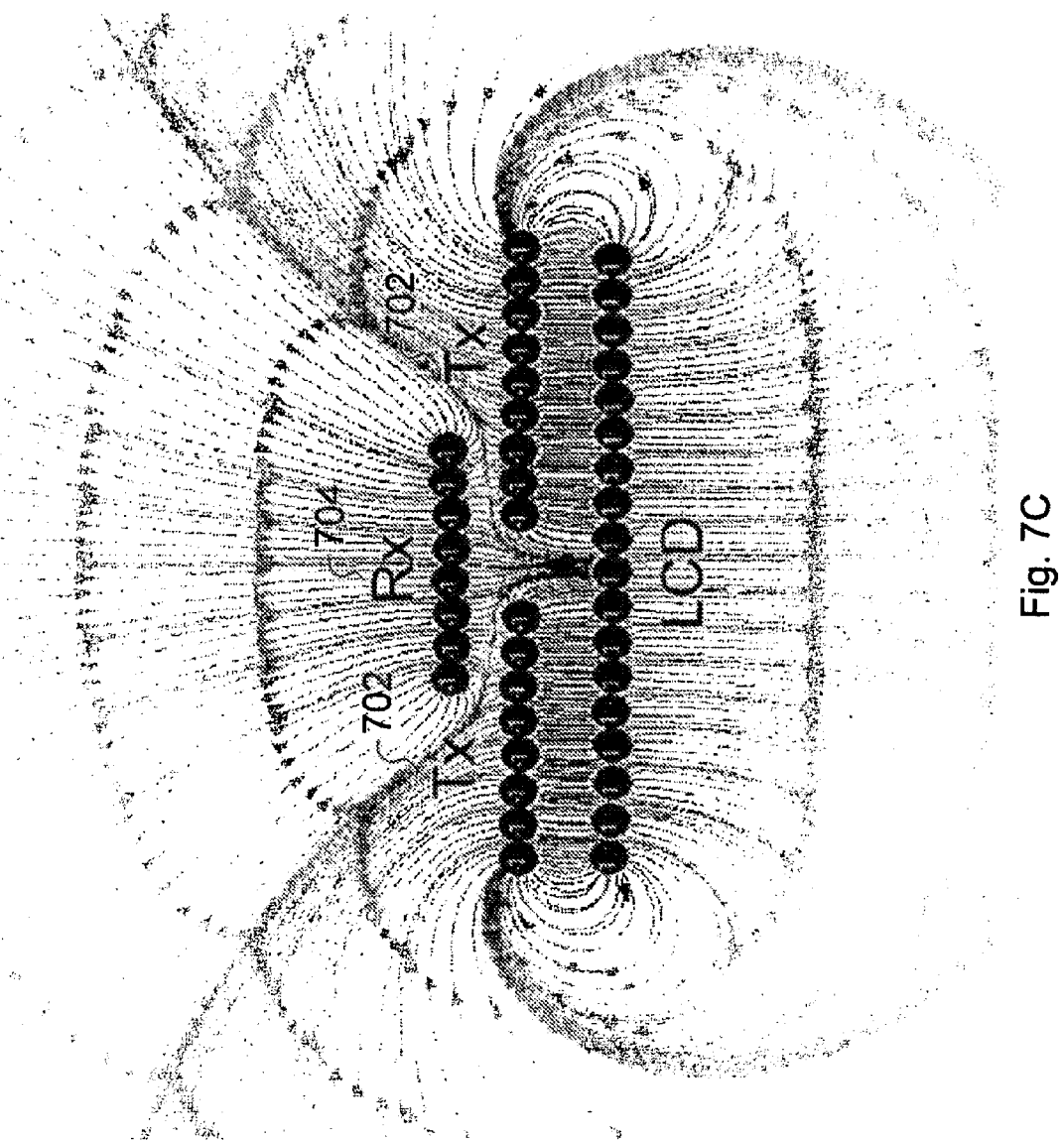
FIG. 7C illustrates a modeling of the electrical field of the sensor assembly of FIG. 7A.

Referring to FIGS. 7A-7B, the sensor assembly 700 includes a receiver line 704 and transmitter line 702, both formed from conductive material, e.g., ITO. The receiver line 704 is formed in a diamond shape to increase sensitivity of the sensor. In addition, the transmitter line 702 also has diamond shaped holes 706. In this embodiment, the parasitic mutual capacitance between transmitter line 702 and receiver lines 704 is reduced by reducing the area in the transmitter line 702, i.e., by creating holes. Moreover, the receiver lines 704 in this configuration have a reduced resistance, but may have some noise as the receiver line could be exposed to LCD noise from the hole as shown in FIG. 7C.

Figures 8A, 8B:
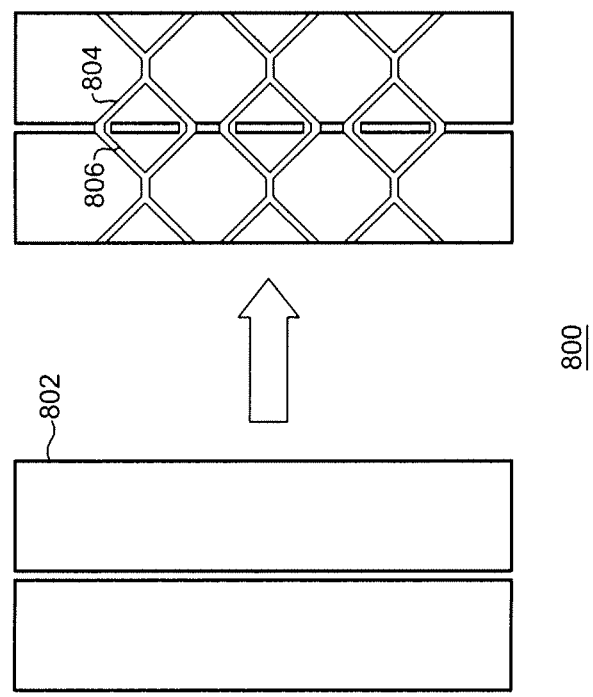
FIGS. 8A and 8B illustrate a top view of a sensor assembly according to another embodiment of the invention.

FIGS. 8A and 8B illustrates a top view of a sensor assembly according to another embodiment of the invention.

Figure 8C:
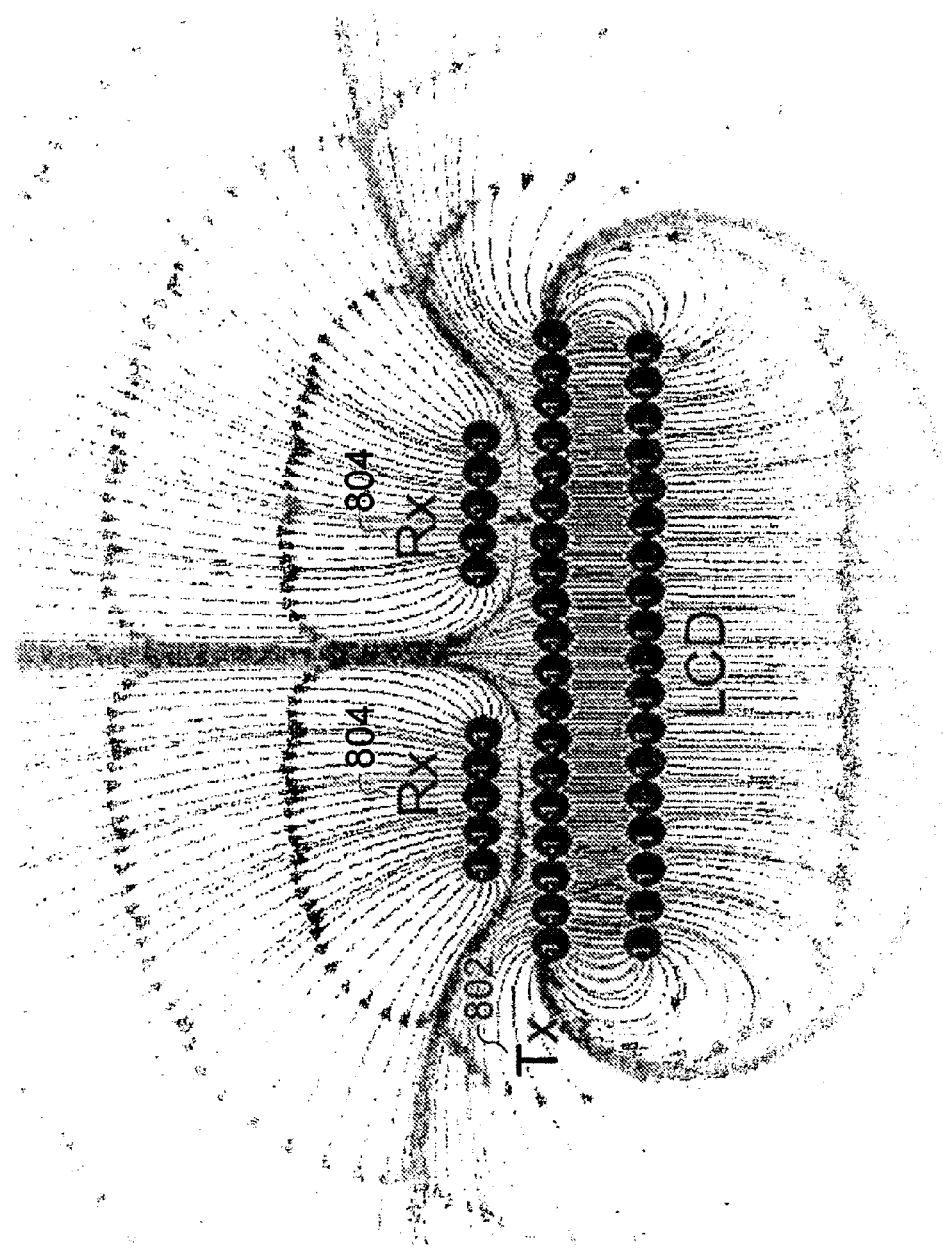
FIG. 8C illustrates a modeling of the electrical field of the sensor assembly of FIG. 8A.

Referring to FIGS. 8A-8B, the sensor assembly 800 includes a transmitter line 802 and receiver line 804 both formed from conductive material, e.g., ITO. The receiver line 804 is formed in a diamond shape to increase sensitivity of the sensor. In this embodiment, the receiver line 804 includes diamond shaped holes 806. In this embodiment, there is no LCD noise to either the receiver line 802 or the transmitter line 804 as the noise is shielded by the transmitter line 804 as shown in FIG. 8C. The diamond shaped receiver line 802 and diamond shaped holes 806 can cause a higher resistance of the receiver line 802 and thereby can cause the system to slow.

Figures 9A, 9B:
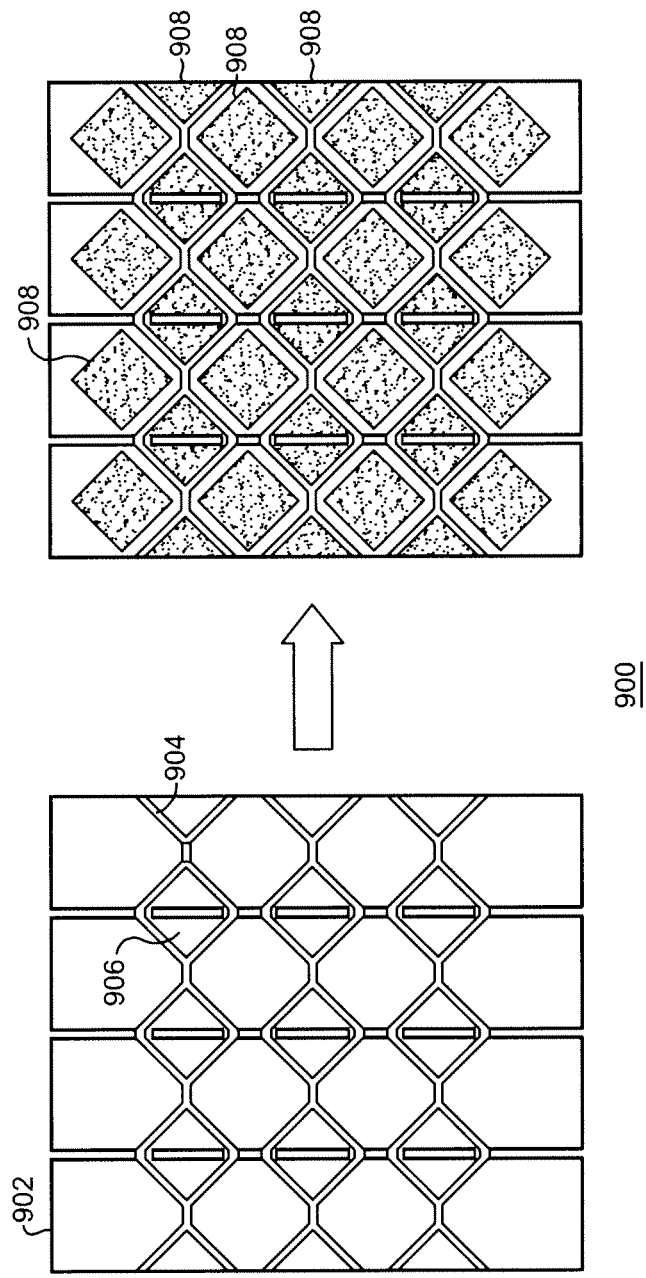
FIG. 9A illustrates a top view of a sensor assembly according to another embodiment of the invention.
FIG. 9B illustrates a cross-sectional view of the sensor assembly according to FIG. 9A.

FIGS. 9A and 9B illustrates a top view of a sensor assembly according to another embodiment of the invention.

Referring to FIGS. 9A-9B, a sensor assembly 900 includes a transmitter line 902 and a receiver line 904, both formed from a conductive material, e.g., ITO. The receiver line 902 is formed in a diamond shape to increase sensitivity of the sensor. In this embodiment, the receiver line 904 includes diamond shaped holes 906. A diamond shaped floating conductive layer 908, e.g., ITO, is also formed over the transmitter line 902. This floating conductive layer 908 is configured to ensure LCD light travels through both the receiver layer line 904 and the floating layer 908 and thereby provides a consistent LCD brightness. The consisted brightness is thus provided by a first ITO layer (transmit layer 902) and a second layer (receiver layer 904, including floating portion 908).

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A sensor assembly apparatus, comprising:
   a transmit portion including a plurality of columns of transmit lines, each transmit line having a conductive rectangular shape in a top view; and
   a receive portion including a plurality of rows of receive lines, each receive line having a plurality of series connected conductive diamond shapes in the top view,
   wherein each diamond shape includes a single slot opening that is aligned with a gap between adjacent ones of the transmit lines.

2. The apparatus of claim 1, wherein a conductive material used for the transmit lines in the transmit portion and used for the receive lines in the receive portion comprises indium tin oxide (ITO).

3. The apparatus of claim 1, wherein each transmit line includes an opening along an edge of the rectangular shape and wherein adjacent openings in the edges of adjacent ones of the transmit lines form a diamond shape in the top view that is aligned with one of the series connected diamond shapes of the receive line.

4. The apparatus of claim 1, further comprising a liquid crystal display (LCD) arranged under the transmit and receive portions and separated therefrom by an air gap.

5. The apparatus of claim 1, wherein edges of the single slot opening are aligned with edges of adjacent ones of the transmit lines.

6. The apparatus of claim 1, further comprising a plurality of floating conductive diamond shapes arranged in the top view over the rectangular shapes of the transmit lines and positioned between the receive lines.

7. A sensor assembly apparatus, comprising:
   a transmit portion including a plurality of columns of transmit lines, each transmit line having a rectangular shape in a top view; and
   a receive portion including a plurality of rows of receive lines, each receive line having a plurality of series connected diamond shapes in the top view,
   wherein each diamond shape includes a single diamond shaped opening having edges parallel to edges of the diamond shape.

8. The apparatus of claim 7, wherein a conductive material used for the transmit lines in the transmit portion and used for the receive lines in the receive portion comprises indium tin oxide (ITO).

9. The apparatus of claim 7, wherein each transmit line includes an opening along an edge of the rectangular shape and wherein adjacent openings in the edges of adjacent ones of the transmit lines form a diamond shape in the top view that is aligned with one of the series connected diamond shapes of the receive line.

10. The apparatus of claim 7, further comprising a liquid crystal display (LCD) arranged under the transmit and receive portions and separated therefrom by an air gap.

11. The apparatus of claim 7, further comprising a plurality of floating conductive diamond shapes arranged in the top view over the rectangular shapes of the transmit lines and positioned between the receive lines.

12. The apparatus of claim 7, further comprising a plurality of floating conductive diamond shapes arranged in the top view within the diamond shaped openings.

13. The apparatus of claim 12, wherein each floating conductive diamond shape includes a single slot opening that is aligned with a gap between adjacent ones of the transmit lines.

14. A sensor assembly apparatus, comprising:
- a transmit portion including a plurality of columns of transmit lines, each transmit line having a rectangular shape in a top view; and
- a receive portion including a plurality of rows of receive lines, each receive line having a plurality of series connected diamond shapes in the top view,
- wherein each transmit line includes an opening along an edge of the rectangular shape and wherein adjacent openings in the edges of adjacent ones of the transmit lines form a diamond shape in the top view that is aligned with one of the series connected diamond shapes of the receive line.

15. The apparatus of claim 14, wherein a conductive material used for the transmit lines in the transmit portion and used for the receive lines in the receive portion comprises indium tin oxide (ITO).

16. The apparatus of claim 14, further comprising a liquid crystal display (LCD) arranged under the transmit and receive portions and separated therefrom by an air gap.

17. The apparatus of claim 14, further comprising a plurality of floating conductive diamond shapes arranged in the top view over the rectangular shapes of the transmit lines and positioned between the receive lines.

18. The apparatus of claim 14, wherein each diamond shape includes a single diamond shaped opening having edges parallel to edges of the diamond shape.

19. The apparatus of claim 14, wherein each diamond shape includes a single slot opening that is aligned with a gap between adjacent ones of the transmit lines.

* * * * *